(12) United States Patent
Rueger

(10) Patent No.: US 6,908,807 B2
(45) Date of Patent: Jun. 21, 2005

(54) METHODS OF FORMING SEMICONDUCTOR CONSTRUCTIONS

(75) Inventor: Neal R. Rueger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/108,013

(22) Filed: Mar. 26, 2002

(65) Prior Publication Data

US 2003/0186501 A1 Oct. 2, 2003

(51) Int. Cl.[7] .................................. H01L 21/8238
(52) U.S. Cl. ..................... 438/221; 438/296; 438/424
(58) Field of Search ........................... 438/221, 296, 438/424, 694, 695, 697, 759, 787, 788, 692, 743, 735, FOR 388; 257/E21.244, E21.245

(56) References Cited

U.S. PATENT DOCUMENTS

| 4,946,550 | A | * | 8/1990 | Van Laarhoven | ............ 438/631 |
| 5,283,692 | A | * | 2/1994 | Herbst | ......................... 359/580 |
| 6,146,963 | A | | 11/2000 | Yu | |
| 6,204,069 | B1 | | 3/2001 | Summerfelt et al. | |
| 6,280,645 | B1 | * | 8/2001 | Yanagisawa et al. | ......... 216/38 |
| 6,485,990 | B1 | * | 11/2002 | Lansford | ......................... 438/5 |
| 6,540,509 | B2 | * | 4/2003 | Asano et al. | ................ 432/205 |
| 6,583,460 | B1 | | 6/2003 | Juengling | .................... 257/296 |
| 6,586,313 | B2 | * | 7/2003 | Pividori | ....................... 438/424 |
| 6,780,771 | B1 | * | 8/2004 | Jayatilaka et al. | .......... 438/690 |

OTHER PUBLICATIONS

U.S. Appl. No. 09/650,071, filed Aug. 29, 2000, Werner Juengling.

* cited by examiner

Primary Examiner—W. David Coleman
Assistant Examiner—Khiem Nguyen
(74) Attorney, Agent, or Firm—Wells St. John P.S.

(57) ABSTRACT

The invention includes a method of forming a semiconductor construction. A semiconductor substrate is placed within a reaction chamber. The substrate comprises a center region and an edge region surrounding the center region. The substrate comprises openings within the center region, and openings within the edge region. While the substrate is within the reaction chamber, a layer of insulative material is formed across the substrate. The layer is thicker over the one of the center region and edge region than over the other of the center region and edge region. The layer is exposed to an etch which removes the insulative material faster from over the one or the center region and edge region than from over the other of the center region and edge region.

48 Claims, 4 Drawing Sheets

METHODS OF FORMING SEMICONDUCTOR CONSTRUCTIONS

TECHNICAL FIELD

The invention pertains to methods of forming semiconductor constructions, and in particular applications pertains to methods of forming insulative material within openings across a semiconductor substrate. The invention can, for example, have application to methods of forming trenched isolation structures.

BACKGROUND OF THE INVENTION

An exemplary method of forming trenched isolation structures is described with reference to FIGS. 1–3. Referring initially to FIG. 1, a semiconductor wafer 10 is illustrated in top view. Wafer 10 comprises a substrate 11. Substrate 11 can comprise, consist essentially of, or consist of, for example, monocrystalline silicon lightly-doped with a background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Wafer 10 is shown to comprise a central (or center) region 12 and an edge region 14 surrounding the central region. Regions 12 and 14 are shown separated by a boundary 15 in the form of a dashed line.

It is to be understood that regions 12 and 14 are defined herein for purposes of explaining an invention which follows. There generally is not a clearly defined boundary between the central region 12 and edge region 14, but rather there is a transition between processing associated with region 12 and that associated with region 14. Regions 12 and 14 can thus be considered to correspond to areas of a wafer in which processing differences occur during fabrication of structures associated with the wafer. For instance, various fabrication processes are found to proceed at a different rate in the central region of a wafer than at the edge region, and the term "center-to-edge uniformity" is frequently utilized in quantitating a difficulty in maintaining constant processing conditions across an entire expanse of a semiconductor wafer surface. Regions 12 and 14 can be considered to correspond to regions across the wafer surface which experience different rates of semiconductor processing due to a lack of center-to-edge uniformity. The different rates can be associated with, for example, different rates of deposition and/or different rates of etching (sputtering), and can result from a lack of center-to-edge process uniformity during processing of wafer 10.

Wafer 10 is illustrated as comprising an upper surface 16, and a plurality of openings 18 (only some of which are labeled) are shown extending into such upper surface. Openings 18 are drawn at a scale far out of proportion to the typical size of openings 18 relative to wafer 10 in order to simplify the illustration. Wafer 10 will have a maximum dimension (such as, for example, a diameter of the shown circular-shaped wafer 10) on the order of several inches (such as, for example, 6 inches, 8 inches, 12 inches, etc.); and openings 18 will typically have a maximum dimension of from about 1 to 100 microns.

Openings 18 can be formed in various shapes, including, for example, circular shapes, oval shapes, rectangular (or trenched) shapes, etc, and are shown comprising rectangular shapes. In particular applications, openings 18 can correspond to trenches which are ultimately to be utilized for forming trenched isolation structures. Exemplary trenched isolation structures are shallow trench isolation structures, with the term "shallow" referring to a trench having a depth of less than about 1 micron.

FIG. 2 illustrates a cross section along the line 2—2 of FIG. 1, and illustrates a center-to-edge variation that can occur within openings 18. Specifically, the openings 18 formed within edge region 14 are deeper than the openings 18 formed within center region 12. Typical processing for forming openings within substrate 11 of wafer 10 utilizes photolithographic processing. A masking layer is formed and patterned across a surface of substrate 11, and subsequently the pattern of the masking layer is etched into the substrate with an appropriate etch chemistry. The masking layer is subsequently removed to leave the structure shown in FIGS. 1 and 2. Frequently, the etch chemistry will proceed more rapidly at the edge region of a wafer than at the central region, and accordingly the openings formed at edge region 14 are deeper than the openings formed in central region 12. A difference in depth between the shallowest openings in region 12 and the deepest openings in region 14 can be from about 100 Å to about 500 Å. Such difference in depth can cause problems in further processing.

FIG. 3 illustrates a layer 20 of insulative material formed over substrate 11 and within openings 18. The Insulative material of layer 20 can comprise, for example, silicon dioxide, and can be formed utilizing high density plasma chemical vapor deposition (HDP-CVD). Ultimately, the openings 18 filled with insulative material of layer 20 can be utilized as trenched isolation regions between integrated circuit devices (not shown). Accordingly, it can be desired that openings 18 be uniformly filled with insulative material of layer 20.

A problem resulting from the increased depth of the openings in edge region 14, relative to the openings in central region 12, is that the processing parameters suitable for filling the openings within the central region are not suitable for uniformly filling the openings within the edge region. Accordingly, keyholes (or voids) 22 can form within the openings 18 in edge region 14, with such keyholes corresponding to gaps within the insulative material formed within the openings. Keyholes 22 can alter the dielectric properties of the isolation regions comprising the keyholes, relative to the desired properties, and can detrimentally affect, or even destroy, suitability of the trenched regions for electrical isolation of adjacent circuit devices.

It is desirable to develop new methods for forming materials within openings across a semiconductor wafer substrate which overcome the prior art problems discussed with reference to FIG. 3.

The layer 20 shown in FIG. 3 can be deposited with various forms of equipment. Two exemplary apparatuses which can be utilized for depositing layer 20 are described with reference to FIGS. 4 and 5.

Referring to FIG. 4, a reaction chamber of a type available from Applied Materials as the ULTIMA HDP-CVD CHAMBER™ is shown diagrammatically as an apparatus 50. Apparatus 50 comprises a reaction chamber 52 surrounded by a sidewall 53. A first set of power coils 54 (typically RF coils) extends across a top of the reaction chamber, and another set of power coils 56 extends along the side of the reaction chamber.

Inlet ports 60 and 62 extend into sides of the reaction chamber, and an inlet port 64 extends through a top of the reaction chamber. Ports 60, 62 and 64 are utilized for introducing precursor (illustrated by arrows 65) into the reaction chamber.

An outlet 66 extends from a bottom of the reaction chamber. A valve 68 extends across the outlet. A pump 70 is provided in fluid communication with the outlet to withdraw materials (typically gaseous materials) from within the chamber and evacuate such materials as exhaust (indicated by an arrow 67).

A wafer holder 72 is provided within chamber 52, and a wafer 10 is shown supported by wafer holder 72. In operation, suitable precursors are flowed through ports 60, 62 and 64 to deposit a desired layer 20 (not shown in FIG. 4) across a surface of wafer 10. A plasma (not shown) is powered by coils 54 and 56 and utilized to enhance the deposition of material from precursors 65.

Referring to FIG. 5, an apparatus 80 corresponding to a Novellus™ system is illustrated schematically. Apparatus 80 comprises a reaction chamber 82 having a sidewall 83. Sidewall 83 includes a dome-shaped upper portion. Power coils 84 are provided around the dome.

Inlet ports 86 and 88 extend into chamber 82 and are utilized for introducing precursors (illustrated by arrows 89) into the reaction chamber. An outlet port 90 extends out of chamber 82, and is utilized for evacuating exhaust materials (illustrated by arrow 91) out of chamber 82. Exhaust port 90 can have a valve (not shown) extending therein, and can be in fluid communication with a suitable pump, such as, for example, a turbo pump (not shown).

A wafer holder 92 is provided within chamber 82, and a wafer 10 is shown supported by wafer holder 92. In operation, precursors 89 are flowed into chamber 82 and a plasma (not shown) is maintained with power coils 84 during deposition of a desired material of layer 20 (shown in FIG. 3, but not in FIG. 5) across an upper surface of wafer 10. The plasma creates reactive deposition precursors as well as providing ionic species which can be accelerated to the wafer via an RF bias applied to the wafer. Accordingly, sputtering (or etching) occurs simultaneously with deposition.

SUMMARY OF THE INVENTION

In one aspect, the invention encompasses a method of forming a semiconductor construction. A semiconductor substrate is placed within a reaction chamber. The substrate comprises a center region and an edge region surrounding the center region. The substrate comprises openings within the center region, and openings within the edge region. While the substrate is within the reaction chamber, a layer of insulative material is formed across the substrate. The layer is thicker over the center region than over the edge region. The layer is subsequently in situ exposed to an etch which removes the insulative material faster from over the center region than from over the edge region. The etch can compensate for non-uniform deposition to from a relatively uniform film across the substrate. The relatively uniform film to contribute to an increased success rate for chemical-mechanical polishing processes that follow the formation of the layer of insulative material.

In one aspect, the invention encompasses a method of forming insulative material within trenches across a semiconductor substrate. A semiconductor substrate is placed within a reaction chamber. The substrate comprises a center region and an edge region surrounding the center region. The substrate also comprises trenches within the center region, as well as within the edge region. The reaction chamber comprises a top over the substrate and sides laterally adjacent the substrate, and has power coils over the top and along the sides. While the substrate is within the reaction chamber, a layer of insulative material is formed across the substrate. A different level of power is supplied to the power coils over the top of the reaction chamber than is supplied to the power coils along the sides of the reaction chamber during formation of the layer of insulative material, and the layer is formed to be thicker over the center region than over the edge region. The amount of power supplied to the power coils over the top of the reaction chamber can be either greater than, or less than, the amount of power supplied to the power coils along the sides of the reaction chamber. After the layer is formed across the substrate, the layer is exposed to an in situ etch (or sputter) which removes insulative material faster from over the center region than from over the edge region. The layer of insulative material extends within the trenches and across portions of the substrate between the trenches after the etch. The layer of insulative material is exposed to chemical-mechanical polishing after the etch to remove the insulative material from over the portions of the substrate between the trenches.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
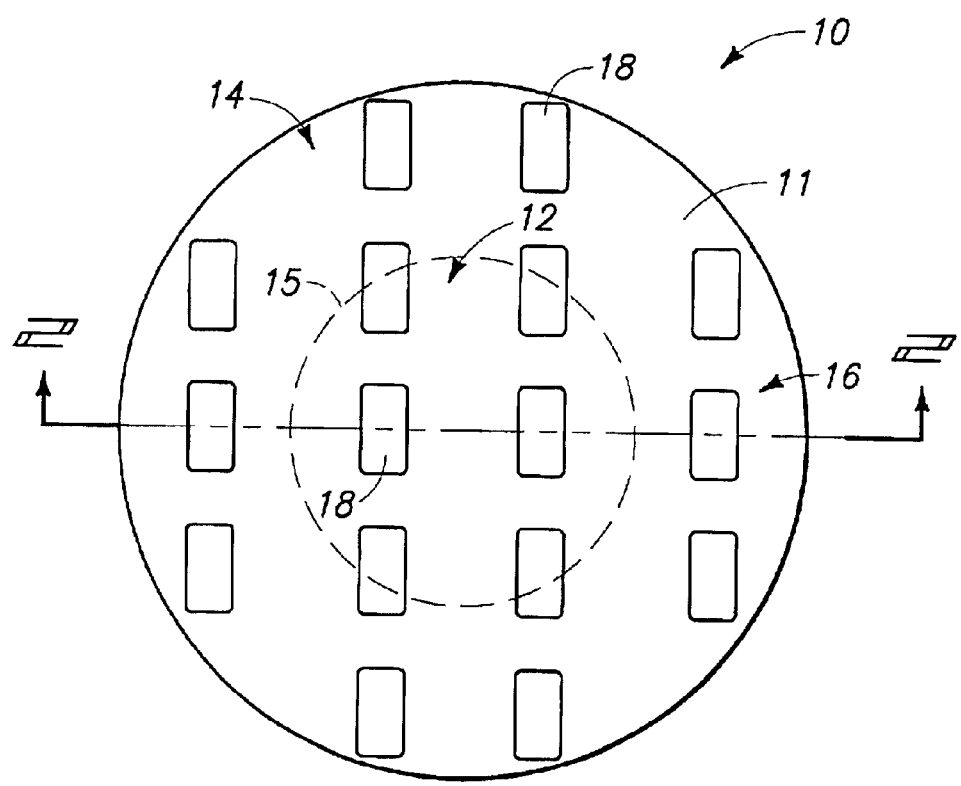
FIG. 1 is a diagrammatic, top view of a prior art semiconductor wafer.

An aspect of the invention is described with reference to FIGS. 6–9. In describing FIGS. 6–9, similar numbering will be utilized as is used above to describe prior art FIGS. 1–3, where appropriate.

Figure 2:
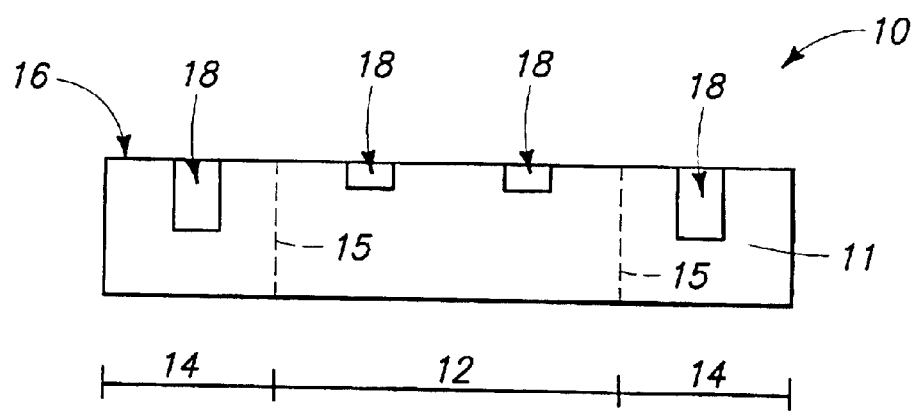
FIG. 2 is a cross-sectional view along the line 2—2 of FIG. 1.
Figure 6:
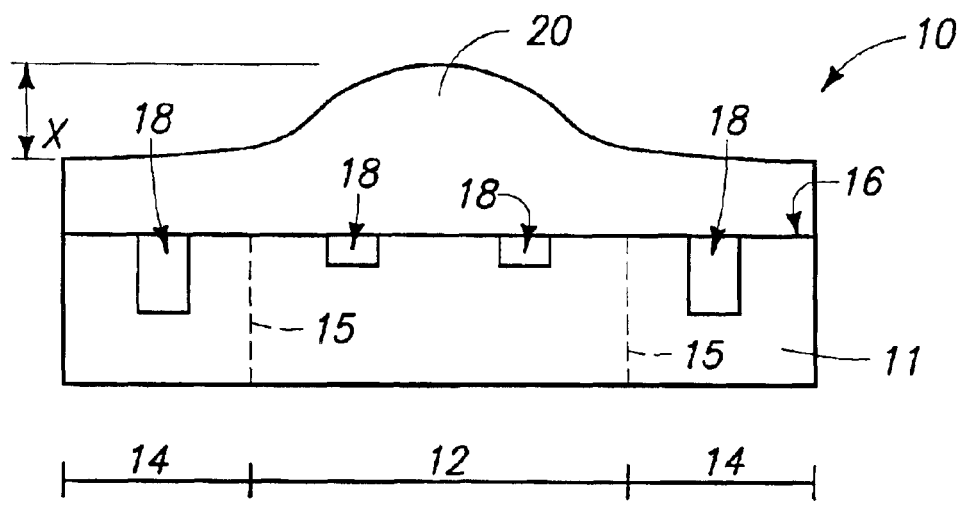
FIG. 6 is a cross-sectional view of a semiconductor wafer at a preliminary processing stage in accordance with an aspect of the present invention.

Referring initially to FIG. 6, semiconductor wafer 10 is illustrated at a processing stage subsequent to that of FIG. 2. Wafer 10 comprises the substrate 11 having openings 18 formed therein. Further, wafer 10 comprises central region 12 and edge region 14, with the edge region 14 having deeper openings 18 than does the central region 12.

An insulative material layer 20 is formed over an upper surface 16 of substrate 11, and within openings 18. Layer 20 will typically be formed to a thickness of somewhere between 2,000 Å and 6,000 Å.

Figure 3:
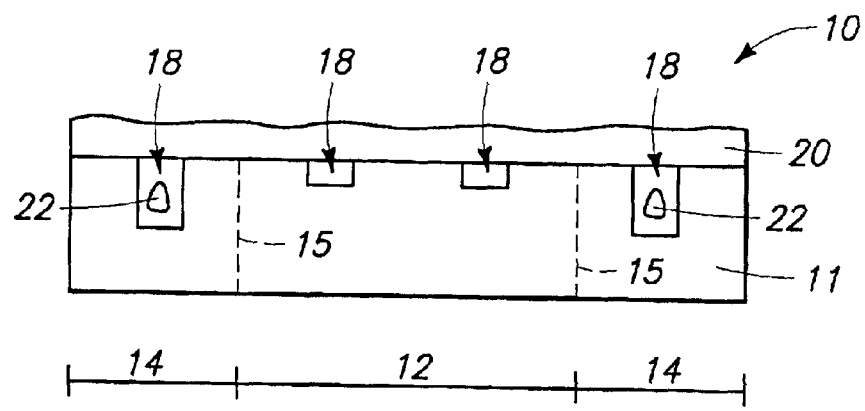
FIG. 3 is a view of the FIG. 2 wafer at a prior art processing stage subsequent to that of FIG. 2.

The insulative material of layer 20 can comprise, for example, silicon dioxide, and can be formed by HDP-CVD. A difference between the layer 20 of FIG. 6 and that of FIG. 3, is that the layer 20 of FIG. 6 is formed in a dome-shape, or in other words, is formed to be thicker over central region 12 than over edge region 14. The layer 20 of FIG. 6 can be considered to comprise a greater average thickness over the center region than over the edge region.

Figure 4:
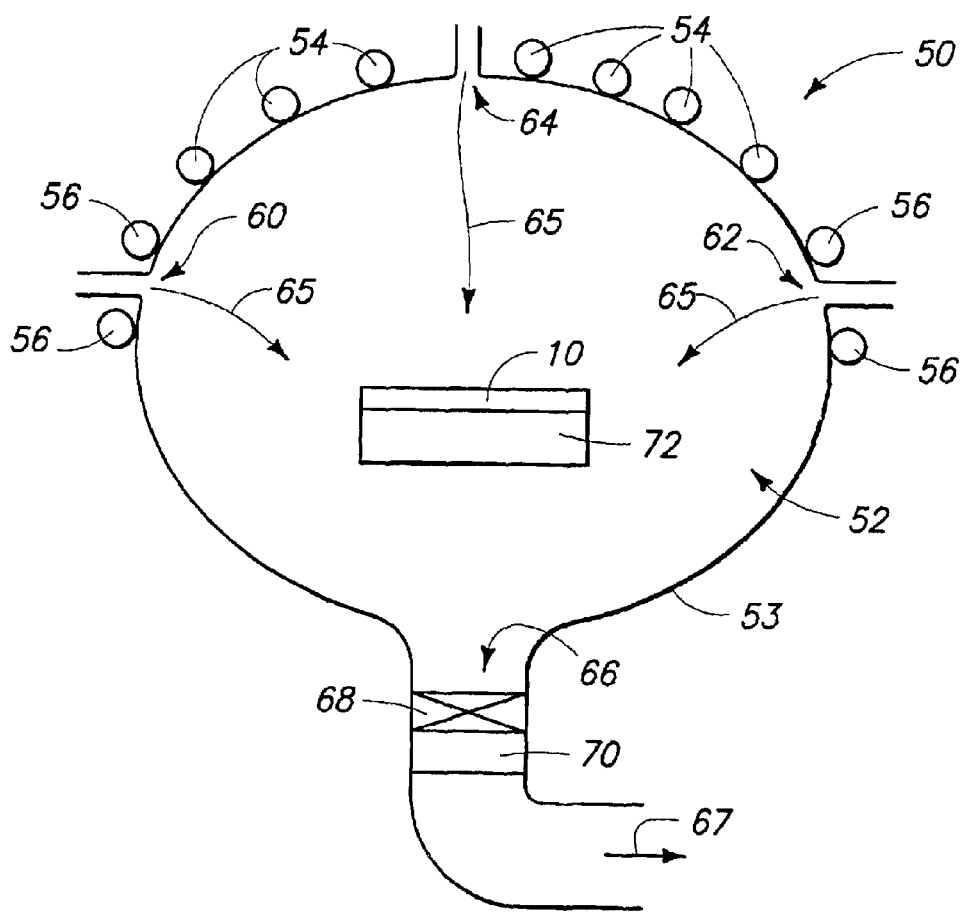
FIG. 4 is a diagrammatic view of a prior art apparatus which can be utilized for high density plasma chemical vapor deposition.

Layer 20 can be formed in the shown dome shape utilizing, for example, the reaction chamber of FIG. 4. Specifically, a wafer can be placed within the reaction chamber, and precursors comprising $SiH_4$ and $O_2$ can be flowed through inlet ports 60, 62 and 64. It is noted that reaction chamber 52 comprises at least one inlet port over a center region of the substrate (specifically, inlet port 64) and at least one inlet port proximate the edge region of the substrate (specifically, inlet ports 60 and 62). For purposes of the discussion that follows, inlet port 64 can be classified as a first inlet, and inlet ports 60 and 62 can be classified as second inlets.

In a particular aspect of the invention, more precursor is flowed through first inlet 64 than is flowed through the second inlets 60 and 62. Accordingly more of material 20 is deposited over center region 12 of substrate 11 than is deposited over edge region 14 of the substrate, to form the dome shape of layer 20 shown in FIG. 6.

The precursor flowed through inlets 60, 62 and 64 can comprise an inert carrier gas in addition to the reactive materials. Suitable inert gases can include, for example, He, Ne, Ar, Xe, and Kr.

Figure 5:
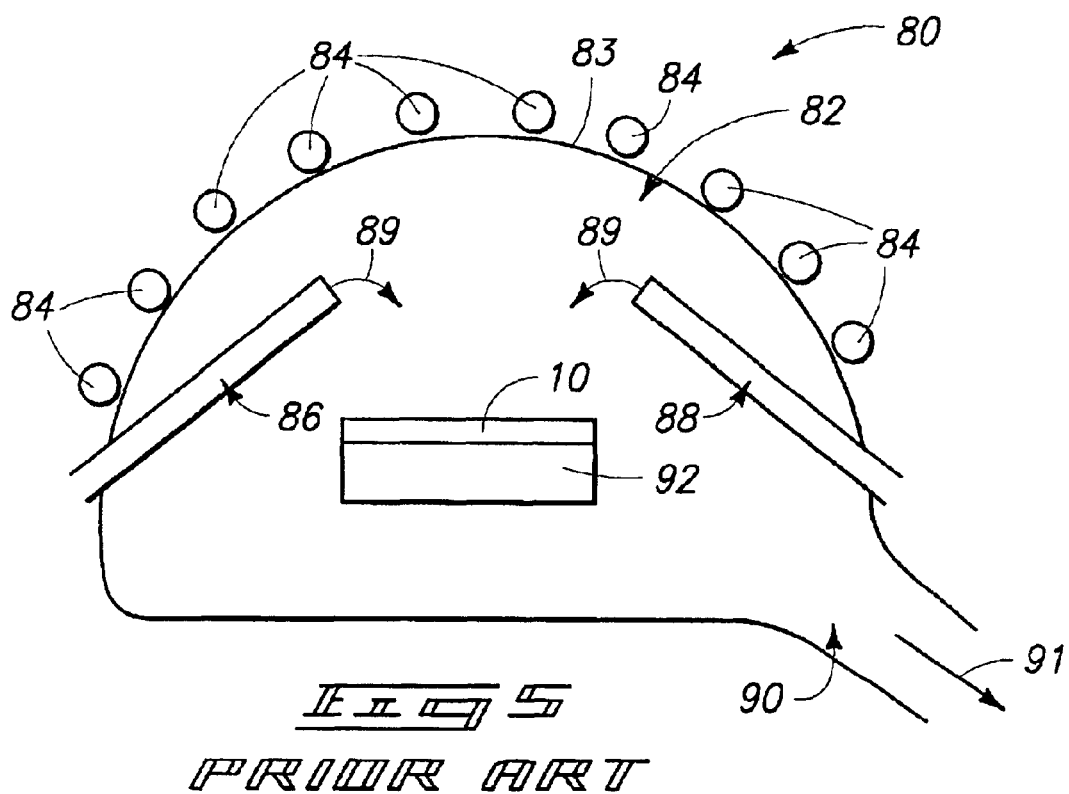
FIG. 5 is a schematic diagram of another prior art apparatus which can be utilized for high density plasma chemical vapor deposition.

The reaction chamber of FIG. 5 can be utilized similarly to the above described utilization of the reaction chamber of FIG. 4, with a minor modification to the shown prior art chamber of FIG. 5 that an inlet port is provided over a central location of the wafer within the chamber 82 of FIG. 5. Then, more precursor material can be flowed through the inlet port over the center region of the wafer (not shown in FIG. 5) than is flowed through inlet ports at lateral (or edge) regions of the wafer, to form the dome shape of layer 20 shown in FIG. 6.

Another method of forming the dome shape of layer 20 in FIG. 6 is to modify the plasma power over the center region of the wafer relative to the power at edge region of the wafer. For instance, the apparatus 50 (FIG. 4) comprises power coils 56 along sides laterally adjacent wafer substrate 10, and comprises power coils 54 over a top (or ceiling) which is above wafer substrate 10. If less power is supplied to power coils 54 than is supplied to power coils 56, a rate of deposition of material 20 over a center region of wafer 10 can be faster than a rate of deposition of the material of layer 20 over the edge region of substrate 10. Accordingly, the dome shape of layer 20 in FIG. 6 can result.

In particular applications, the modification of plasma power and adjustment of precursor flow are utilized concurrently to form the dome shape of layer 20. In an exemplary application, precursors comprising $SiH_4$ and $O_2$ are utilized to form a silicon dioxide material layer 20 over a top surface of the wafer substrate, and the power within coils 54 is lower than the power within coils 56 while simultaneously injecting more precursor through inlet 64 than through inlets 60 and 62. Such application is found to form material 20 significantly thicker over center region 12 than over edge region 14.

The reaction chamber 82 of FIG. 5 can be utilized in a manner similar to that discussed above for the reaction chamber of FIG. 4 in applications in which a power over a top of a reaction chamber is to be different than a power at sides of the reaction chamber. Specifically, it is noted that power coils 84 extend across both the sides and top of the dome-shaped reaction chamber 82. If the power coils located most centrally relative to the top of the dome are provided with less power than the coils located laterally along sides of the dome, a rate of deposition of material at a center of the wafer substrate 10 can be increased relative to a rate of deposition at edges of the substrate 10.

The processes described above for increasing a rate of deposition over a center portion of a wafer substrate relative to the deposition rate at edge portions of the substrate can be considered to modify a deposition to sputter ratio (d/s) (alternatively referred to as deposition to etch ratio (d/e)) at the center region relative to the edge region. Specifically, the d/s of the center region is greater than that at the edge region. Such allows uniform flow of material of layer 20 into the deep openings 18 of the edge region, as well as within the shallow openings 18 of the center region. Deep openings 18 of the edge region can be considered to have a lower ratio of width to depth than shallow openings 18, and accordingly lower d/s can be required to uniformly fill the openings 18 at the edge region than is required to uniformly fill the openings 18 in the center regions. In exemplary applications of the present invention, the d/s at the edge region can be from about 0 to about 200, and the d/s at the center region can be from about 0 to about 200, but they are generally not equivalent for a given process.

In particular aspects of the invention, there can be a significant difference in the thickness of layer 20 over edge region 14 relative to the thickness over center region 12. Although the thickness over edge region 14 and the thickness over center region 12 can both be, for example, from about 2000 Å to about 10,000 Å, the thickness over the center region 12 is generally significantly different from that over the edge region. Such can lead to a significant variation across the topography of wafer substrate 11. For instance, FIG. 6 illustrates a difference "X" between the height of the elevationally lowest portions of layer 20 over edge region 14 and the elevationally highest portions of layer 20 over center region 12. Such difference "X" can be, for example, from about 500 Å to about 4000 Å.

If the difference "X" exceeds 500 Å, such can cause difficulties during subsequent planarization (such as, for example, chemical-mechanical polishing) of layer 20. Accordingly, it can be desired to reduce the topographical variation across an upper surface of layer 20. Such reduction can be accomplished utilizing an etch illustrated in FIG. 7. The etch can comprise ion milling (i.e., can be a purely physical etch). Alternatively, the etch can comprise a reactive ion etch (i.e., can utilize an etchant material which chemically reacts with material of layer 20), and can thus utilize both physical and chemical aspects of an etchant (i.e., sputtering component).

Figure 7:
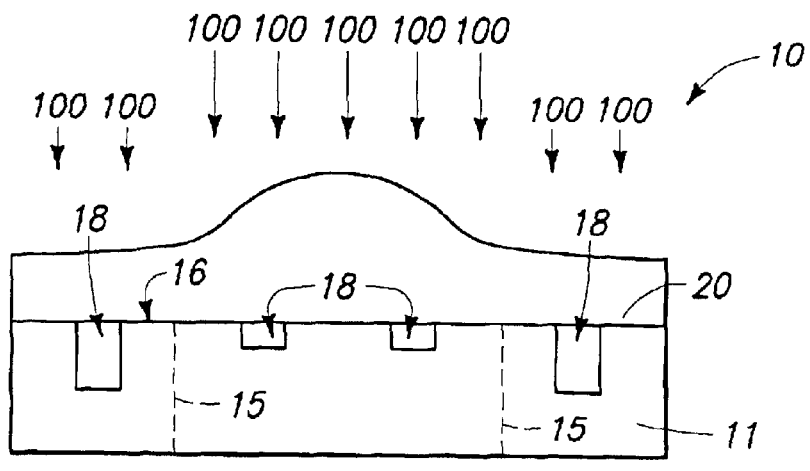
FIG. 7 is a view of the FIG. 6 wafer shown at a processing stage subsequent to that of FIG. 6.

The etchant is illustrated with arrows 100 in FIG. 7, and the power and/or concentration of etchant over center region 12 is shown increased relative to the concentration and/or power over edge region 14 (as illustrated diagrammatically by the larger arrows over center region 12 than over edge region 14). Accordingly, material of layer 20 is etched faster from over center region 12 than from over edge region 14. The etchant 100 utilized in the sputter etch of FIG. 7 can comprise, for example, one or more of argon, neon, xenon and krypton, in embodiments in which a purely physical etch is desired. The etchant can additionally, or alternatively, comprise one or more of $Si^+$, $SiH^+$, $SiH_2^+$, $SiH_3^+$, $SiH_4^+$, $O^+$, and $O_2^+$; or any positive ion (typically from a plasma) with sufficient mass. Alternatively, the etchant can comprise, for example, $NF_3$ (or a fragment of $NF_3$, such as $NF_x^+$ or $F_y^+$, where x and y are less than 3) in embodiments in which the sputter etch is desired to utilize a sputtering component that both chemically and physically interacts with insulative material of layer 20.

The etch of layer 20 can occur within the same reaction chamber utilized for deposition of the insulative material of layer 20, or can be conducted in a separate reaction chamber.

Figure 8:
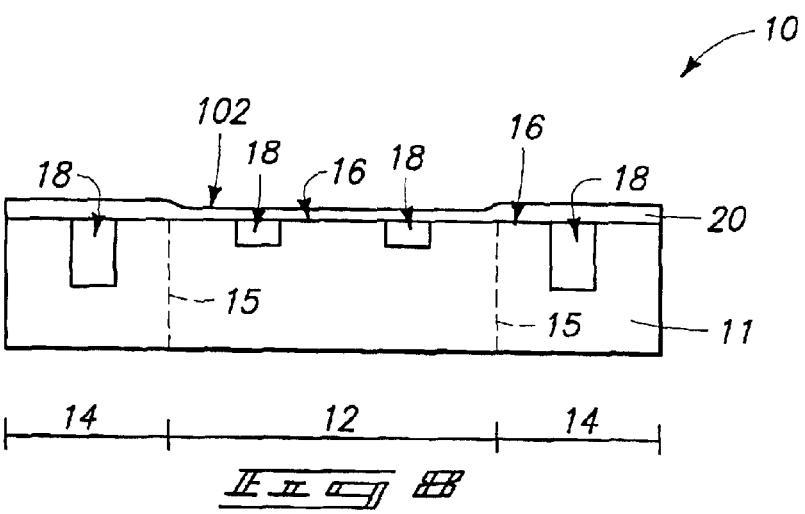
FIG. 8 is a view of the FIG. 6 wafer shown at a processing stage subsequent to that of FIG. 7.

Referring to FIG. 8, wafer 10 is illustrated after the etch of FIG. 7. Since the FIG. 7 etch has removed material of insulative layer 20 faster from over center region 12 than over edge region 14, the etch has reduced the topological variation of layer 20 in addition to thinning of the layer. In the shown embodiment, a slight excess of layer 20 has been removed from over center region 12 relative to over edge region 14 to form a small concavity 102 over the center region of layer 20. The concavity is preferably small enough that it does not substantially interfere with subsequent chemical-mechanical polishing of layer 20. Layer 20 can be considered to comprise a concave shape across substrate 11 in the shown aspect of the invention.

Figure 9:
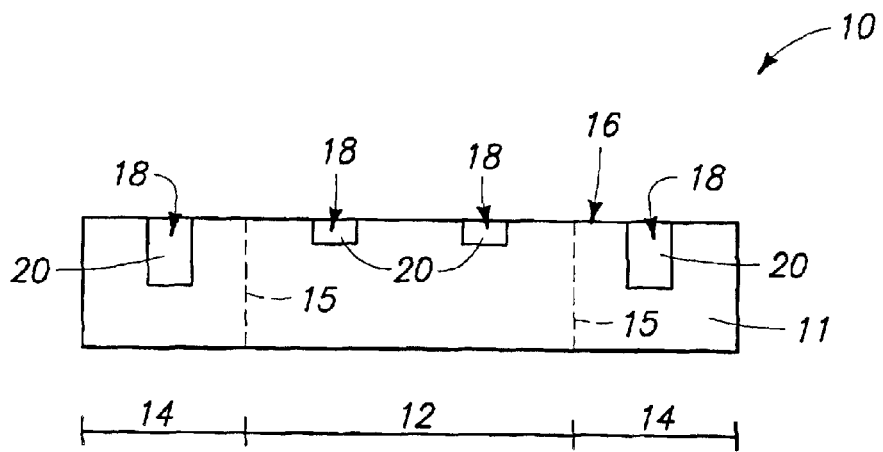
FIG. 9 is a view of the FIG. 6 wafer shown at a processing stage subsequent to that of FIG. 8.

The layer 20 of insulative material of FIG. 8 comprises portions extending within openings 18, and other portions extending across upper surface 16 of substrate 11 between the openings 18. The portions of layer 20 extending over surface 16 can be removed by suitable planarization, such as, for example, chemical-mechanical polishing, to form the resulting structure shown in FIG. 9. It is noted that some of substrate 11 can be removed during the chemical-mechanical polishing so that the upper surface 16 of substrate 11 in FIG. 9 is elevationally lower than the upper surface 16 of substrate 11 in FIG. 8.

In subsequent processing (not shown) various conductive circuit elements can be formed over and/or within substrate 11, and the insulative material 20 remaining within openings 18 can be incorporated into trenched isolation devices, such as, for example, shallow trench isolation regions.

EXAMPLES

An exemplary deposition process is described in the table below as Exemplary Deposition.

| | Exemplary Deposition |
|---|---|
| Step End Control | By time |
| Maximum Step Time | 69.0 seconds |
| Endpoint Selection | No endpoint |
| Pressure Control | Turbo throttle valve fully open |
| RF Power Top, Side | 800 W, 3600 W |
| RF Bias Power, Match | 2000 W, Off |
| Microwave Power | 0 W |
| Gas Names and Flows | Ar-SIDE: 70 sccm |
| | Ar-TOP: 10 sccm |
| | $O_2$-SIDE: 108 sccm |
| | $O_2$-TOP: 17 sccm |
| | $SiH_4$-SIDE: 48 sccm |
| | $SiH_4$-TOP: 7.13 sccm |

The typical ranges utilized for an Applied Materials ULTIMA™-type chamber are described in the following table.

| Step | Typical Ranges |
|---|---|
| Maximum Step Time | 1–200 or beyond seconds |
| Pressure Control | Turbo throttle valve fully open to fully closed |
| RF Power Top, Side | 0 W–5000 W, 0 W–5000 W |
| RF Bias Power, Match | 0 W–5000 W |
| Microwave Power | 0 W (not typically used for deposition, but instead used for cleaning only) |
| Gas Names and Flows | Ar-SIDE: 0–200 sccm |
| | Ar-TOP: 0–25 sccm |
| | $O_2$-SIDE: 0–200 sccm |
| | $O_2$-TOP: 0–50 sccm |
| | $SiH_4$-SIDE: 0–150 sccm |
| | $SiH_4$-TOP: 0–25 sccm |

Although the invention is described above with reference to methods of forming an insulative material (20 of FIG. 6) with a greater average thickness over a center region of a wafer than over an edge region, it is to be understood that the methodology can also be utilized to form layers having a greater average thickness over an edge region of a wafer than over a center region. For instance, if precursor flow is adjusted to be heavier along lateral edges of a wafer than over a center of the wafer, and/or if power within a chamber is adjusted to increase a deposition/etch ratio over an edge region of a wafer than over a center region, the layer can be formed to be thicker over the edge region than over the center region. Subsequent etching analogous to that of FIG. 7, but different in that the etch is faster over the edge region than over the center region, can then be conducted to reduce topological variation of the layer across a wafer surface.

It is also noted that although the invention is described with reference to methods of depositing and etching layers of electrically insulative material across a semiconductor substrate, the methodology can also be applied to electrically conductive materials.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a semiconductor construction, comprising:

placing a semiconductor substrate within a reaction chamber, the substrate comprising a center region and an edge region surrounding the center region; the substrate comprising openings within the center region and openings within the edge region; the openings within the center region being generally shallower than the openings within the edge region;

while the substrate is within the reaction chamber, forming a layer of insulative material across the substrate, the layer having a greater average thickness over the center region as compared to the edge region; and exposing the layer to an etch which removes the insulative material faster from the greater average thickness over the center region than from over the edge region.

2. The method of claim 1 wherein the substrate remains in the reaction chamber during the exposing of the layer to the etch.

3. The method of claim 1 wherein the insulative material comprises silicon dioxide.

4. The method of claim 1 wherein the insulative material comprises silicon dioxide, and wherein the forming the layer of insulative material comprises depositing the layer of insulative material from $SiH_4$ and $O_2$.

5. The method of claim 1 wherein:
the reaction chamber comprises atop over the substrate and sides laterally adjacent the substrate;
the reaction chamber has power coils over the top and along the sides; and
during the forming of the insulative material, less power is supplied to the power coils over the top of the reaction chamber than is supplied to the power coils along the sides of the reaction chamber.

6. The method of claim 1 wherein:
the insulative material comprises silicon dioxide;
the forming the layer of insulative material comprises depositing the layer of insulative material from $SiH_4$ and $O_2$;
the reaction chamber comprises a top over the substrate and sides laterally adjacent the substrate;
the reaction chamber has power coils over the top and along the sides; and
during the depositing, less power is supplied to the power coils over the top of the reaction chamber than is supplied to the power coils along the sides of the reaction chamber.

7. The method of claim 1 wherein:
the reaction chamber has at least one first precursor inlet over the center region of the substrate, and has at least one second precursor inlet proximate the edge region of the substrate;
the insulative material is formed from precursor flowed through the first and second precursor inlets; and
during the forming of the insulative material, more precursor is flowed through the at least one first precursor inlet than is flowed through the at least one second precursor inlet.

8. The method of claim 1 wherein:
the insulative material comprises silicon dioxide;
the forming the layer of insulative material comprises depositing the layer of insulative material from precursor materials comprising $SiH_4$ and $O_2$;
the reaction chamber has at least one first precursor inlet over the center region of the substrate, and has at least one second precursor inlet proximate the edge region of the substrate; and
during the forming of the insulative material, more of the precursor materials are flowed through the at least one first precursor inlet than are flowed through the at least one second precursor inlet.

9. The method of claim 1 wherein the layer of insulative material has a dome shape across the substrate prior to the etch.

10. The method of claim 1 wherein:
the layer of insulative material has a dome shape across the substrate prior to the etch; and
the layer of insulative material has a concave shape across the substrate after the etch.

11. The method of claim 1 wherein the etch is a sputter etch utilizing sputtering components comprising one or more of argon, neon, xenon, krypton, and a positive ion within a plasma.

12. The method of claim 1 wherein the etch is a sputter etch utilizing a sputtering component that physically interacts with the material of the layer, but which does not chemically interact with the material of the layer.

13. The method of claim 1 wherein the etch is a sputter etch utilizing a sputtering component that both chemically and physically interacts with the material of the layer.

14. The method of claim 1 wherein the etch is a sputter etch utilizing a sputtering component comprising $NF_3$.

15. The method of claim 1 wherein the layer of insulative material extends within the openings and across portions of the substrate between the openings after the etch; the method further comprising, after the etch, exposing the layer of insulative material to chemical-mechanical polishing to remove the insulative material from over the portions of the substrate between the openings while leaving the insulative material within the openings.

16. The method of claim 15 wherein the insulative material remaining in the openings after the chemical-mechanical polishing is incorporated into trenched isolation devices.

17. The method of claim 1, wherein flow of material of the layer is uniformly provided into the openings within the center region as well as the openings within the edge region.

18. A method of forming a semiconductor construction, comprising:
placing a semiconductor substrate within a reaction chamber; the substrate comprising a center region and an edge region surrounding the center region; the substrate comprising trenches within the center region and trenches within the edge region; the trenches within the center region being generally shallower than the trenches within the edge region;
while the substrate is within the reaction chamber, depositing a layer of material across the substrate; the layer having a greater average thickness over the center region than over the edge region; and
while the substrate is within the reaction chamber, and after the depositing, exposing the layer to an etch which removes the material faster from the greater average thickness over the center region than from over the edge region.

19. The method of claim 18 wherein:
the material comprises an insulative material; and
the depositing comprises high pressure plasma chemical vapor deposition.

20. The method of claim 18 wherein:
the material comprises an insulative material; and
the depositing comprises high pressure plasma chemical vapor deposition.

21. The method of claim 18 wherein:
the layer is deposited to fill the trenches in the center and edge regions;
the material comprises an insulative material;
the depositing comprises high pressure plasma chemical vapor deposition; and
the material within the trenches is incorporated into shallow trench isolation regions.

22. The method of claim 21 wherein the material consists essentially of silicon dioxide.

23. The method of claim 21 wherein the etch is a sputter etch utilizing sputtering components comprising one or more of argon, neon, xenon, krypton, and a positive ion within a plasma.

24. The method of claim 21 wherein the etch is a sputter etch utilizing a sputtering component that physically interacts with the material of the layer, but which does not chemically interact with the material of the layer.

25. The method of claim 21 wherein the etch is a sputter etch utilizing a sputtering component that both chemically and physically interacts with the material of the layer.

26. The method of claim 21 wherein the etch is a sputter etch utilizing a sputtering component comprising $NF_3$ or a fragment of $NF_3$.

27. A method of forming a semiconductor construction, comprising:
    placing a semiconductor substrate within a reaction chamber; the substrate comprising a center region and an edge region surrounding the center region; the substrate comprising trenches within the center region and trenches within the edge region; the trenches within the center region being generally shallower than the trenches within the edge region; the reaction chamber comprising a top over the substrate and sides laterally adjacent the substrate; the reaction chamber having power coils over the top and along the sides;
    while the substrate is within the reaction chamber, forming a layer of insulative material across the substrate; less power being supplied to the power coils over the top of the reaction chamber than is supplied to the power coils along the sides of the reaction chamber during the forming of the layer of insulative material to form the layer to be thicker over the center region than over the edge region;
    exposing the layer to an etch which removes the insulative material faster from over the center region than from over the edge region; the layer of insulative material extending within the trenches and across portions of the substrate between the trenches after the etch; and
    after the etch, exposing the layer of insulative material to chemical-mechanical polishing to remove the insulative material from over the portions of the substrate between the trenches.

28. The method of claim 27 wherein the substrate remains in the reaction chamber during the exposing of the layer to the etch.

29. The method of claim 27 wherein the insulative material comprises silicon dioxide.

30. The method of claim 27 wherein the insulative material comprises silicon dioxide, and wherein the forming the layer of insulative material comprises depositing the layer of insulative material from $SiH_4$ and $O_2$.

31. The method of claim 27 wherein:
    the reaction chamber has at least one first precursor inlet over the center region of the substrate, and has at least one second precursor inlet proximate the edge region of the substrate;
    the insulative material is formed from precursor flowed through the first and second precursor inlets; and
    during the forming of the insulative material, more precursor is flowed through the at least one first precursor inlet than is flowed through the at least one second precursor inlet.

32. The method of claim 27 wherein:
    the insulative material comprises silicon dioxide;
    the forming the layer of insulative material comprises depositing the layer of insulative material from precursor materials comprising $SiH_4$ and $O_2$;
    the reaction chamber has at least one first precursor inlet over the center region of the substrate, and has at least one second precursor inlet proximate the edge region of the substrate; and
    during the forming of the insulative material, more of the precursor materials are flowed through the at least one first precursor inlet than are flowed through the at least one second precursor inlet.

33. The method of claim 27 wherein the layer of insulative material has a dome shape across the substrate prior to the etch.

34. The method of claim 27 wherein the layer of insulative material has a dome shape across the substrate prior to the etch; and wherein the layer of insulative material has a concave shape across the substrate after the etch.

35. The method of claim 27 wherein the etch is a sputter etch utilizing sputtering components comprising one or more of argon, neon, xenon, krypton, and a positive ion within a plasma.

36. The method of claim 27 wherein the etch is a sputter etch utilizing a sputtering component that physically interacts with the material of the layer, but which does not chemically interact with the material of the layer.

37. The method of claim 27 wherein the etch is a sputter etch utilizing a sputtering component that bath chemically and physically interacts with the material of the layer.

38. The method of claim 27 wherein the etch is a sputter etch utilizing a sputtering component comprising $NF_3$ or a fragment of $NF_3$.

39. A method of forming a semiconductor construction, comprising:
    placing a semiconductor substrate within a reaction chamber; the substrate comprising a center region and an edge region surrounding the center region; the substrate comprising trenches within the center region and trenches within the edge region; the trenches within the center region being generally shallower than the trenches within the edge region; the reaction chamber having at least one first precursor inlet over the center region of the substrate, and having at least one second precursor inlet proximate the edge region of the substrate;
    while the substrate is within the reaction chamber, forming a layer of insulative material across the substrate; the insulative material being formed from precursor flowed through the first and second precursor inlets; more precursor being flowed through the at least one first precursor inlet than is flowed through the at least one second precursor inlet during the forming of the insulative material to form the layer to be thicker over the center region than over the edge region;
    exposing the layer to an etch which removes the insulative material faster from over the center region than from over the edge region; the layer of insulative material extending within the trenches and across portions of the substrate between the trenches after the etch; and
    after the etch, exposing the layer of insulative material to chemical-mechanical polishing to remove the insulative material from over the portions of the substrate between the trenches.

40. The method of claim 39 wherein the substrate remains in the reaction chamber during the exposing of the layer to the etch.

41. The method of claim 39 wherein the insulative material comprises silicon dioxide.

42. The method of claim 39 wherein the insulative material comprises silicon dioxide, and wherein the precursor includes $SiH_4$ and $O_2$.

43. The method of claim 39 wherein the layer of insulative material has a dome shape across the substrate prior to the etch.

44. The method of claim 39 wherein the layer of insulative material has a dome shape across the substrate prior to the etch; and wherein the layer of insulative material has a concave shape across the substrate after the etch.

45. The method of claim 39 wherein the etch is a sputter etch utilizing sputtering components comprising one or more of argon, neon, xenon, krypton, and a positive ion within a plasma.

46. The method of claim 39 wherein the etch is a sputter etch utilizing a sputtering component that physically interacts with the material of the layer, but which does not chemically interact with the material of the layer.

47. The method of claim 39 wherein the etch is a sputter etch utilizing a sputtering component that both chemically and physically interacts with the material of the layer.

48. The method of claim 39 wherein the etch is a sputter etch utilizing a sputtering component comprising $NF_3$ or a fragment of $NE_3$.

* * * * *

UNITED STATES PATENT AND TRADEMARK OFFICE
CERTIFICATE OF CORRECTION

PATENT NO.         : 6,908,807 B2
APPLICATION NO. : 10/108013
DATED                : June 21, 2005
INVENTOR(S)       : Neal R. Rueger It is certified that error appears in the above-identified patent and that said Letters Patent is hereby corrected as shown below:

Title Page, Abstract – (Col. 2, line 32)
  Replace "The one or the center region and edge region than from over"
  Insert --The one of the center region and edge region than from over--

Col. 12, line 21 –
  Replace "etch utilizing a sputtering component that bath chemically"
  Insert --etch utilizing a sputtering component that both chemically--

Col. 14, line 8 –
  Replace "fragment of $NE_3$."
  Insert --fragment of $NF_3$.--

Signed and Sealed this

Twentieth Day of March, 2007

JON W. DUDAS
*Director of the United States Patent and Trademark Office*